United States Patent [19]
Lage

[11] Patent Number: 5,329,486
[45] Date of Patent: Jul. 12, 1994

[54] FERROMAGNETIC MEMORY DEVICE

[75] Inventor: Craig S. Lage, Austin, Tex.

[73] Assignee: Motorola, Inc., Schaumburg, Ill.

[21] Appl. No.: 96,204

[22] Filed: Jul. 23, 1993

Related U.S. Application Data

[63] Continuation of Ser. No. 873,139, Apr. 24, 1992, abandoned.

[51] Int. Cl.$^5$ .............................................. G11C 17/02
[52] U.S. Cl. ...................................... 365/145; 365/33; 365/55; 365/66; 365/84; 365/98; 365/154
[58] Field of Search ................. 365/145, 55, 66, 97, 365/98, 33, 48, 65, 74, 84, 117, 129, 132, 243.5, 173, 154; 257/531, 295

[56] References Cited

U.S. PATENT DOCUMENTS

| | | | |
|---|---|---|---|
| 3,155,948 | 11/1964 | Stern; M. M. | 365/55 |
| 3,419,855 | 12/1968 | Nelson | 365/97 |
| 3,753,485 | 4/1971 | Ballard | 365/129 |
| 4,103,340 | 6/1978 | Fayling | 365/97 |
| 4,831,427 | 5/1989 | Coleman, Jr. | 365/171 |
| 4,887,236 | 12/1989 | Schloemann | 365/154 |

Primary Examiner—Eugene R. LaRoche
Assistant Examiner—Tan Nguyen
Attorney, Agent, or Firm—Keith E. Witek

[57] ABSTRACT

A ferromagnetic memory circuit (10) and a ferromagnetic memory device (15) which has a substrate (42). Within the substrate (42), a first current electrode (44) and a second current electrode (46) are formed. A control electrode (50) is formed to control current flow between the first and second current electrodes (44 and 46). A ferromagnetic region (68) is used to store a logic value via magnetic flux. Two conductive layers (62 and 70) and a conductive spacer (78) form a sense conductor for device (15). The sense conductor is used to externally provide the logic value stored in the device (15). A conductive layer (82) forms a program/erase line for altering the logic value stored in the device (15). A logic one or a logic zero is stored in ferromagnetic region (68) depending upon a direction and a magnitude of current flow through conductive layer (82).

24 Claims, 6 Drawing Sheets

FERROMAGNETIC MEMORY DEVICE

This application is a continuation of prior application Ser. No. 07/873,139, filed Apr. 24, 1992 abandoned.

FIELD OF THE INVENTION

The present invention relates generally to semiconductor technology, and more particularly, to memories.

BACKGROUND OF THE INVENTION

A plurality of memory circuits is currently being manufactured by the semiconductor industry. One memory circuit is known as a dynamic random access memory (DRAM). DRAMs are made of many DRAM cells. A popular DRAM cell is known as the one transistor DRAM cell. This popular DRAM cell has a single transistor and a single capacitor connected in series. The capacitor stores a logic one or a logic zero known as a bit, and the transistor allows for both selective reading and writing of the capacitor. The capacitor in a DRAM cell slowly discharges over time and must be occasionally "refreshed" or rewritten to a logic zero or logic one in order to hold a logic value for a long period of time. DRAM cells, due to the fact that only one transistor and one capacitor are needed, tend to take up a small surface area. A cell with a small surface area allows for memory integrated circuits with millions of bits of storage.

Another form of a semiconductor memory is a static random access memory (SRAM). An SRAM is formed by connecting two inverters in a ring configuration. The output of a first inverter is connected to the input of a second inverter, and the output of the second inverter is connected to the input of the first inverter. A pair of pass transistors allows for selective read and write access to the SRAM cell. The SRAM cell, unlike the DRAM cell, is internally stable and therefore needs no refreshing. SRAM cells require a minimum of six elements, for example six transistors, and therefore have a larger surface area than a DRAM cell. Both DRAM cells and SRAM cells lose all stored information if power is lost or removed from the memory cell.

Another form of memory is referred to as a nonvolatile memory. Two popular forms of nonvolatile memory are erasable programmable read only memory (EPROM) or electrically erasable programmable read only memory (EEPROM). An EPROM or an EEPROM memory cell has a transistor with a floating gate and a control gate. The floating gate controls current flow between a source and a drain of the memory cell. The control gate programs the floating gate to an "on" or "off" state, also referred to as a logic one or logic zero state, via predetermined voltage settings. Both the EPROM cell and the EEPROM cell are physically larger than the DRAM cell in terms of surface area, but the EPROM and EEPROM cells retain all stored information if a power supply voltage fails or is removed.

Magnetic memory has been used for computers and like applications for many years. Ferromagnetic cores, rings, or cylinders are positioned in a predetermined array. The ferromagnetic cores, rings, or cylinders are physically large and are most likely much larger than any of the previously mentioned semiconductor memory devices. Three conductive lines pass through the center of each of the ferromagnetic cores in the predetermined array. A first conductive line runs horizontal and is a row decoder line. A second conductive line runs vertical and is a column decoder line. A third conductive line senses the stored polarity in a predetermined ferromagnetic core.

To program and erase a ferromagnetic core to a logic zero or a logic one, a current $I_1$ having a direction (polarity) is flowed through the row decoder line and a current $I_2$ having a direction (polarity) is flowed through the column decoder line. Usually, $I_1$ is equal to $I_2$. All cores not on the row or the column which is carrying the current $I_1$ or $I_2$ are subjected to a net current of zero and are not affected. All cores on either a row or a column but not both are subjected to either a current $I_1$ or $I_2$ and are not affected. The core that has both row and column decoder lines through it is subjected to a current of $I_1$ plus $I_2$ and is either programmed or erased depending on the direction (polarity) of the currents $I_1$ and $I_2$. Therefore, by respectively applying a row and column current $I_1$ and $I_2$, only one ferromagnetic core is selected with a large enough current to store or alter information. The magnetic cores tend to be physically large but are robust and more error-free than DRAMs for example.

SUMMARY OF THE INVENTION

The previously mentioned disadvantages are overcome and other advantages achieved with the present invention. In one form, the present invention comprises a ferromagnetic memory circuit and device, and method of formation. A substrate is provided having a surface. A transistor is formed having a first current electrode which is formed within the substrate and exposed at the surface of the substrate. A second current electrode of the transistor is formed within the substrate and exposed at the surface of the substrate. A control electrode of the transistor is formed substantially between the first current electrode and the second current electrode. The control electrode controls current flow between the first current electrode and the second current electrode. A ferromagnetic region is formed overlying the substrate and positioned in close proximity to the transistor. An opening is formed in the ferromagnetic region. A conductive region is formed within the opening in the ferromagnetic region, the conductive region being electrically coupled to the first current electrode.

The present invention will be more clearly understood from the detailed description below in conjunction with the accompanying drawings.

DESCRIPTION OF THE PREFERRED EMBODIMENT

Figure 1:
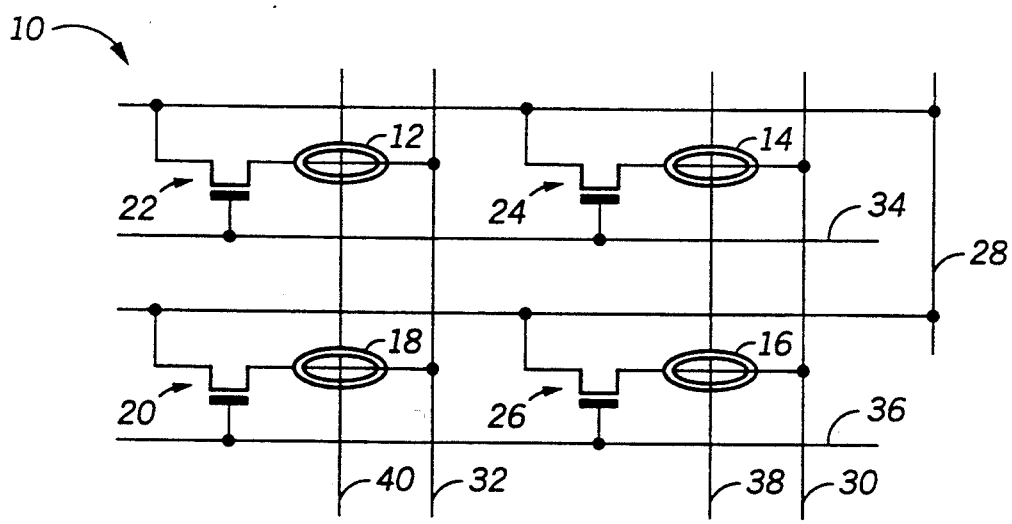
FIG. 1 illustrates in a schematic diagram a magnetic memory circuit in accordance with the present invention.

Illustrated in FIG. 1 is a schematic of a magnetic memory circuit 10. Circuit 10 illustrates four memory cells or four bits of storage. A first memory cell has a transistor 22 and a ferromagnetic core 12. A second memory cell has a transistor 24 and a ferromagnetic core 14. A third memory cell has a transistor 20 and a ferromagnetic core 18. A fourth memory cell has a transistor 26 and a ferromagnetic core 16. Each magnetic core 12, 14, 16, and 18 is electrically isolated from all other conductors in circuit 10. A power supply conductor 28 connects a first current electrode of each of the transistors 20, 22, 24, and 26 to a power supply voltage. A typical supply voltage is either a ground potential or any other predetermined positive or negative voltage. It is important to note that the transistors 20-26 are illustrated as metal oxide semiconductor field effect transistors (MOSFETs) but may be bipolar transistors.

A bit line conductor 30 passes through the cores 14 and 16 and respectively connects to a second current electrode of each of the transistors 24 and 26. A bit line conductor 32 passes through the cores 12 and 18 and respectively connects to a second current electrode of each of the transistors 20 and 22. All current electrodes described herein may either be emitters or collectors for bipolar transistors, or either sources or drains for MOSFETs. In addition, it is known that most sources and drains of MOSFETs are symmetrical and may be interchanged functionally. The bit line conductors 30 and 32 are used to carry a current through the ferromagnetic cores 12, 14, 16, and 18 to either "erase" or "program" the cores 12, 14, 16, and/or 18. Erase implies programming a core to a logic zero state, and program implies programming a core to a logic one state.

A word line conductor 34 is connected to a control electrode of both transistors 22 and 24. A word line conductor 36 is connected to a control electrode of both transistors 20 and 26. Each of the word line conductors 34 and 36 turns on a different row of transistors. If the transistor of a memory cell is selected by a word line and a current is passed through the cell's bit line, then the cell is either programmed or erased depending upon the polarity of the current in the bit line. For example, if word line conductor 34 is a logic one, transistors 22 and 24 are conducting in an "on" state. If a current is passed through conductor 30, then the core 14 is either programmed to a logic one or erased to a logic zero. For magnetic memory cells, logic zeros and logic ones are stored via magnetic flux in the cores 12-18. All other cells are not affected because either the cell's bit line conductor was not carrying a current or the cell's transistor was not "on".

Sense line conductors 38 and 40 function to read either a logic zero state or a logic one state from a predetermined core 12, 14, 16, or 18. To read a core, for example core 18, transistor 20 is turned "on" via word conductor 36. A read current is passed through core 18 via the bit line conductor 32. If the read current in bit line conductor 32 does not oppose the magnetic flux stored in core 18, then no current is induced in the sense line conductor 40. If the read current in the bit line conductor 32 opposes the magnetic flux stored in core 18, then the flux stored in core 18 will be forced to change direction and will induce a current through sense line conductor 40.

Sense amplifiers (not illustrated) are coupled to sense line conductors 38 and 40 to detect the presence of current through conductors 38 and 40. For example, if no current is detected through sense line conductor 40, then a logic one value is read. If current is detected through sense line conductor 40, then a logic zero value is read. It should be apparent that either the presence or absence of current through sense line conductor 40 may be predetermined to be either a logic zero or a logic one. If a current is detected through sense line conductor 40, the logic state of the core 18 has been altered by the read current provided by bit line conductor 32. In order to restore the previous logic state, current is passed through the core via bit line conductor 32 in a direction opposite to the read current to re-program the core 18.

Figure 2:
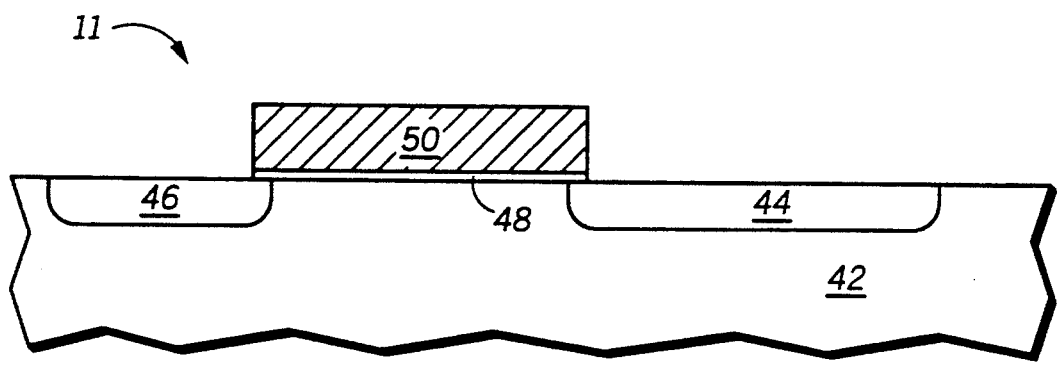
FIGS. 2-4 illustrate, in cross-sectional form, a method for forming a magnetic memory device in accordance with the present invention.
Figure 3:
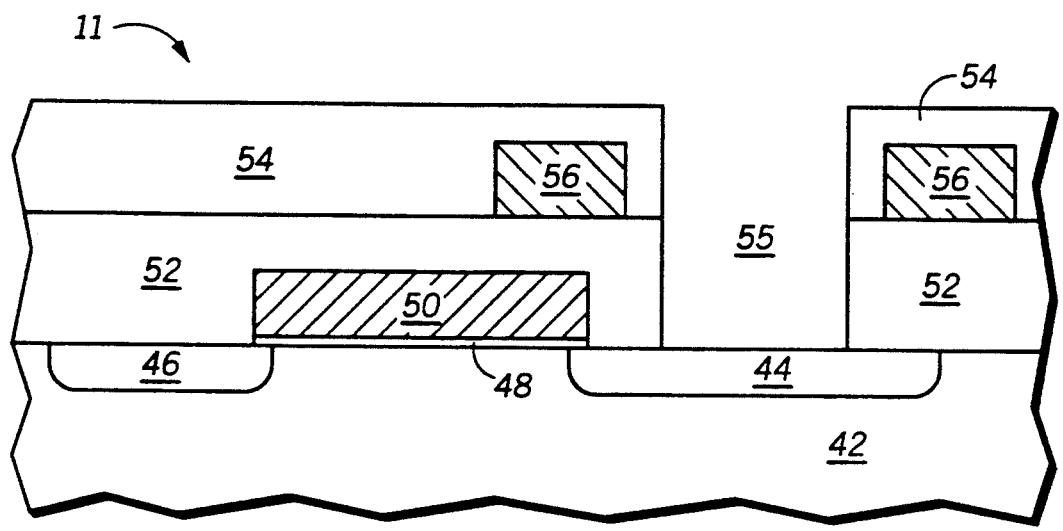
Figure 4:
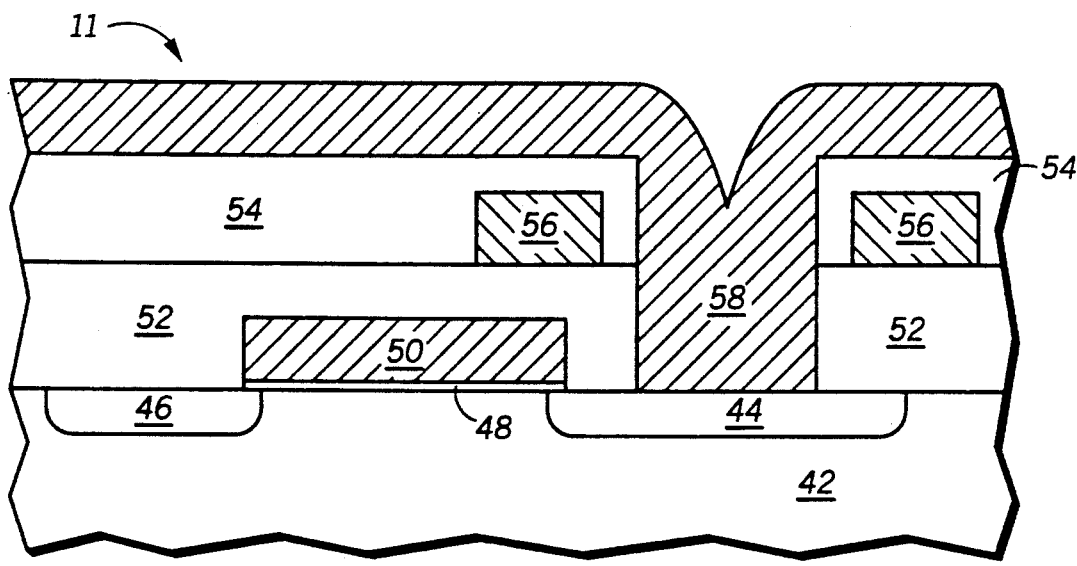

FIGs. 2-4 illustrate a method used to fabricate a memory cell or ferromagnetic memory device 11 for use in the circuit 10 of FIG. 1. In FIG. 2, a substrate 42 which has a surface is provided. Substrate 42 may be made of silicon, gallium arsenide, silicon on sapphire, epitaxial formations, germanium, germanium silicon, polysilicon, and/or like substrate materials. Preferably, the substrate 42 is made of single-crystalline silicon and has a first conductivity type which is either N type or P type. A first current electrode 44 is formed within the substrate 42 and is exposed at the surface of the substrate 42. A second current electrode 46 is formed within the substrate 42 and is exposed at the surface of the substrate 42. Both the first and the second current electrodes 44 and 46 have a second conductivity type which is opposite the first conductivity type. A channel region separates the first and second current electrodes 44 and 46. The first and second current electrodes 44 and 46 are also known respectively as a source electrode and a drain electrode.

A gate dielectric layer 48 is formed overlying the channel region. The gate dielectric layer 48 is preferably a grown silicon dioxide ($SiO_2$) layer. In general, the dielectric layers described herein may be wet or dry silicon dioxide ($SiO_2$), nitride, tetra-ethyl-ortho-silicate (TEOS) based oxides, boro-phosphate-silicate-glass (BSPG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$), a spin on glass (SOG), and/or like dielectric materials unless otherwise noted.

A gate electrode, referred to as a control electrode 50, is formed overlying the dielectric layer 48. The control electrode 50 is a conductive material and preferably polysilicon. The gate dielectric layer 48 and the control electrode 50 are formed via conventional deposition, photolithographic, and etch techniques. The control electrode 50 is formed overlying the channel region, and controls current flow between the electrodes 44 and 46. Control electrode 50 is either analogous to or connected to the conductor 34 of FIG. 1. Collectively, electrodes 44, 46 and 50, and dielectric layer 48 form a planar metal oxide semiconductor field effect transistor (MOSFET) analogous to transistor 22 of FIG. 1.

In FIG. 3, a dielectric layer 52 is formed overlying the electrodes 44, 46, and 50. Planarization of the layer 52 via chemical and/or mechanical polishing or the use of an SOG is illustrated in FIG. 3 but is not required. A ferromagnetic region 56 is formed overlying layer 52 and overlying the electrode 44. It is advantageous to place ferromagnetic region 56 in close proximity to the transistor. Ferromagnetic region 56 is preferably a ferrite (iron oxide) material or a soft ferromagnetic material. Some examples of acceptable ferromagnetic materials are 45 Permalloy, Orthonol, 78 Permalloy, Supermalloy, Supermedur, and the like. An opening is etched into the ferromagnetic region 56 to produce a cylindrical core of ferromagnetic material. Region 56 is analogous to core 12 of FIG. 1. A dielectric layer 54 is formed overlying the ferromagnetic region 56. Planarization of dielectric layer 54 is illustrated but is not required. A contact opening 55 is formed within the opening in the ferromagnetic region 56. The contact opening 55 exposes a surface of the electrode 44.

In FIG. 4, the contact opening 55 is filled with a conductive region or conductive layer 58. Conductive layer 58 may either be polysilicon, a metal material, a silicided material, a salicided region, a combination of conductive materials, or like conductive materials. Preferably, a chemical vapor deposition (CVD) step is used to form conductive layer 58. Conductive layer 58 functions as both the conductor 40 and conductor 32 of FIG. 1. The conductive layer 58 is used to program and erase the ferromagnetic region 56 and therefore performs the functions of conductor 32 of FIG. 1. In addition, a read current is passed through conductive layer 58 to read a logic value stored in ferromagnetic region 56. Conductive layer 58 is connected to sensitive current sensor circuits (not illustrated) which are used to detect current variations in the conductive layer 58. The current variations are induced by changing flux in ferromagnetic region 56 and are used to determine which logic state, either logic one or logic zero, is stored in ferromagnetic region 56.

Figure 5:
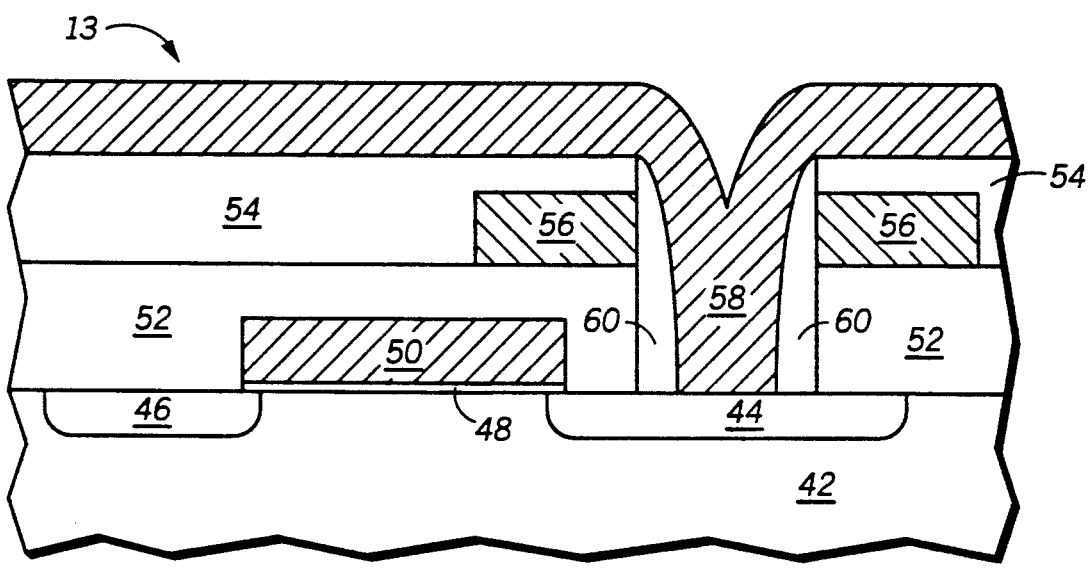
FIG. 5 illustrates, in cross-sectional form, an alternative magnetic memory device in accordance with the present invention.

FIG. 5 illustrates a method of forming a ferromagnetic storage device 13 which is similar to device 11 of FIGS. 2-4. For device 13, the etch step used to form contact opening 55 in FIG. 3 is also used to form the opening in ferromagnetic region 56. Therefore, ferromagnetic region 56 is self-aligned to the electrode 44-to-conductive layer 58 contact in FIG. 5. A sidewall spacer 60 is used to isolate the region 56 from the conductive layer 58. In some cases, sidewall spacer 60 is not needed and the ferromagnetic region 56 can be in contact with the conductive layer 58. If conductive layer 58 is polysilicon or metal, and ferromagnetic region 56 is ferromagnetic, no electrical short circuits or leakage occurs between ferromagnetic region 56 and conductive layer 58 and the device 13 should still operate normally.

Figure 6:
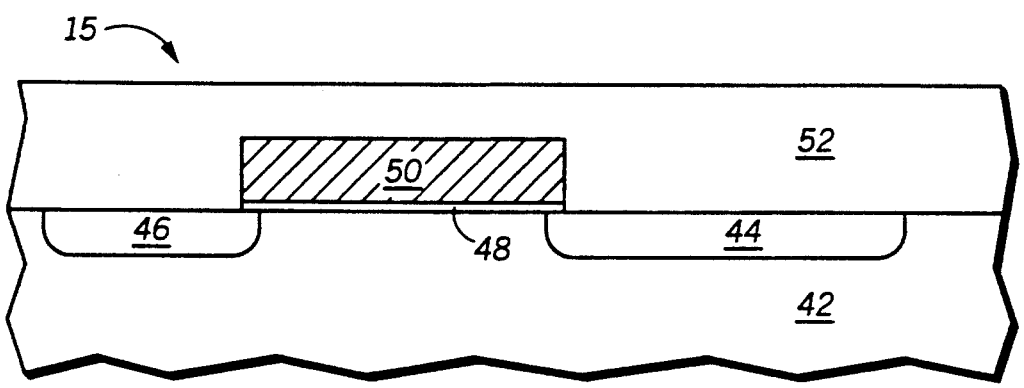
FIGs. 6-11 illustrate, in cross-sectional form, a method for forming yet another magnetic memory device in accordance with the present invention.

FIGS. 6-11 illustrate a method for forming a ferromagnetic storage device 15 for use in the circuit 10 of FIG. 1. Several elements of FIGS. 6-11 are identically labeled to analogous elements of FIGS. 2-4. In FIG. 6, a planar MOSFET is formed in a manner similar to the MOSFET illustrated in FIG. 2. Electrode 50 is either analogous to or connected to the word line conductor 34 of FIG. 1. In FIG. 6, the dielectric layer 52 is formed overlying the electrodes 44, 46, and 50 in a manner similar to FIG. 3. Planarization of dielectric layer 52 is optional.

Figure 7:
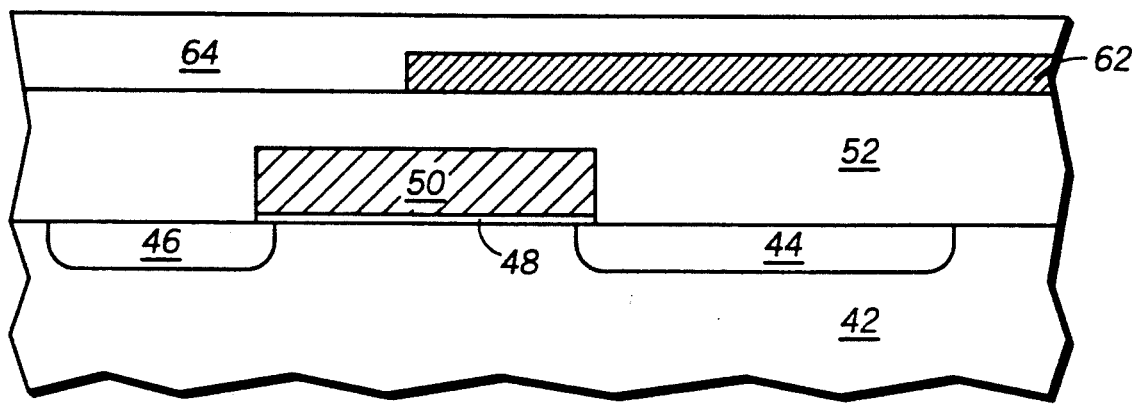

In FIG. 7, a conductive layer 62 is formed overlying the dielectric layer 52. Preferably, conductive layer 62 is polysilicon. A dielectric layer 64 is formed overlying the layer 62. Dielectric layer 64 may be planarized although planarization is not required.

Figure 8:
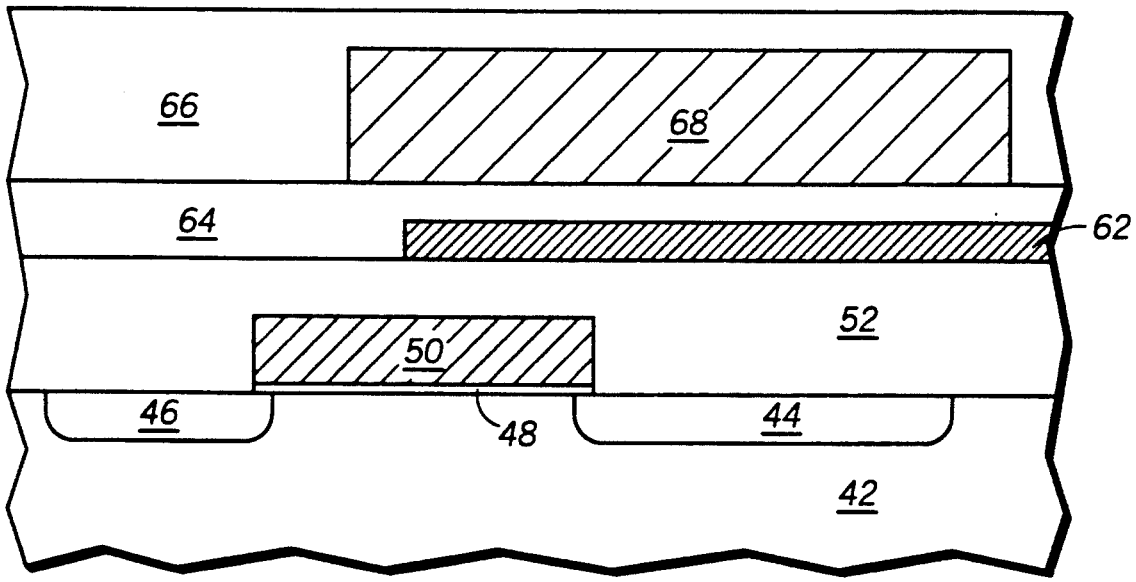

In FIG. 8, a ferromagnetic region 68 is formed overlying the dielectric layer 64. Ferromagnetic region 68 is analogous to the core 12 of FIG. 1. A dielectric layer 66 is formed overlying the ferromagnetic region 68 and is optionally planarized. Dielectric layers 52, 64, and 66 are preferably a TEOS based oxide or the like.

Figure 9:
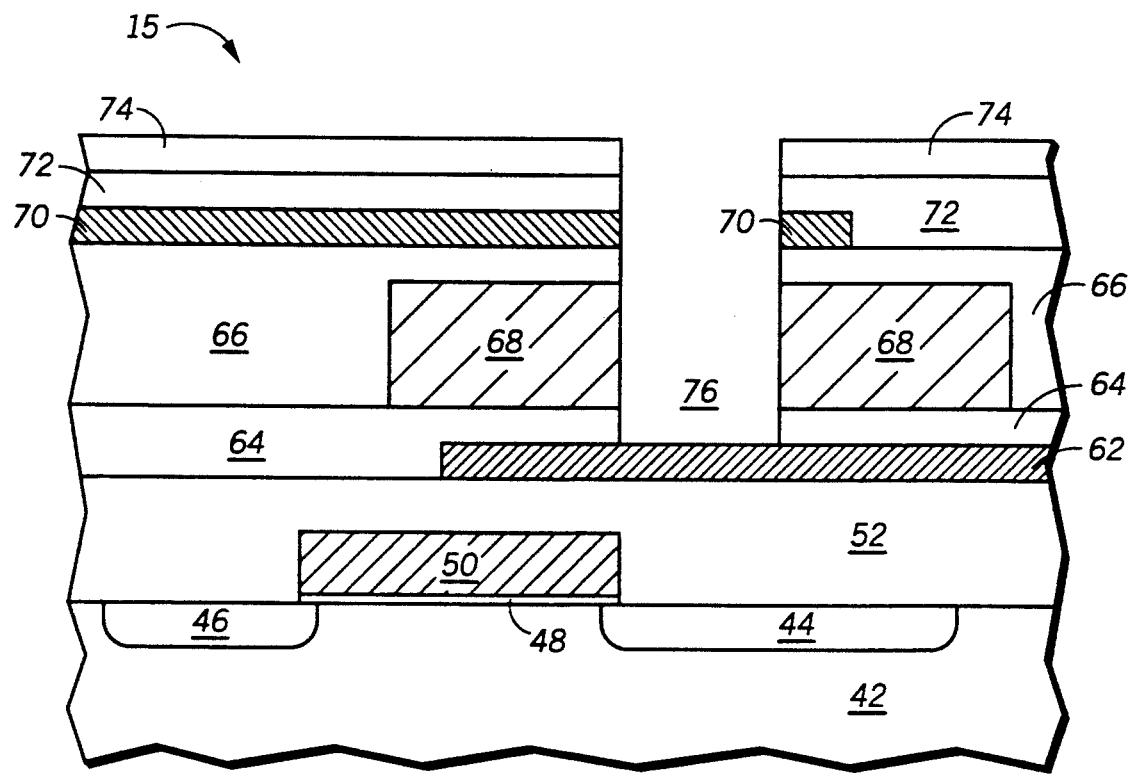

In FIG. 9, a conductive layer 70 is formed overlying the dielectric layer 66. A dielectric layer 72, which is preferably a TEOS based oxide or the like, is formed overlying the conductive layer 70. A dielectric layer 74, which is preferably silicon nitride, is formed overlying the layer 72. Planarization of layers 72 and 74 is optional. A contact hole 76 is formed through layers 74, 72, 70, 66, and 64, and ferromagnetic region 68 via known selective etch steps or conventional non-selective etching techniques. Contact hole 76 either exposes a portion of the conductive layer 62 or etches through conductive layer 62 to form an exposed sidewall of conductive layer 62.

Figure 10:
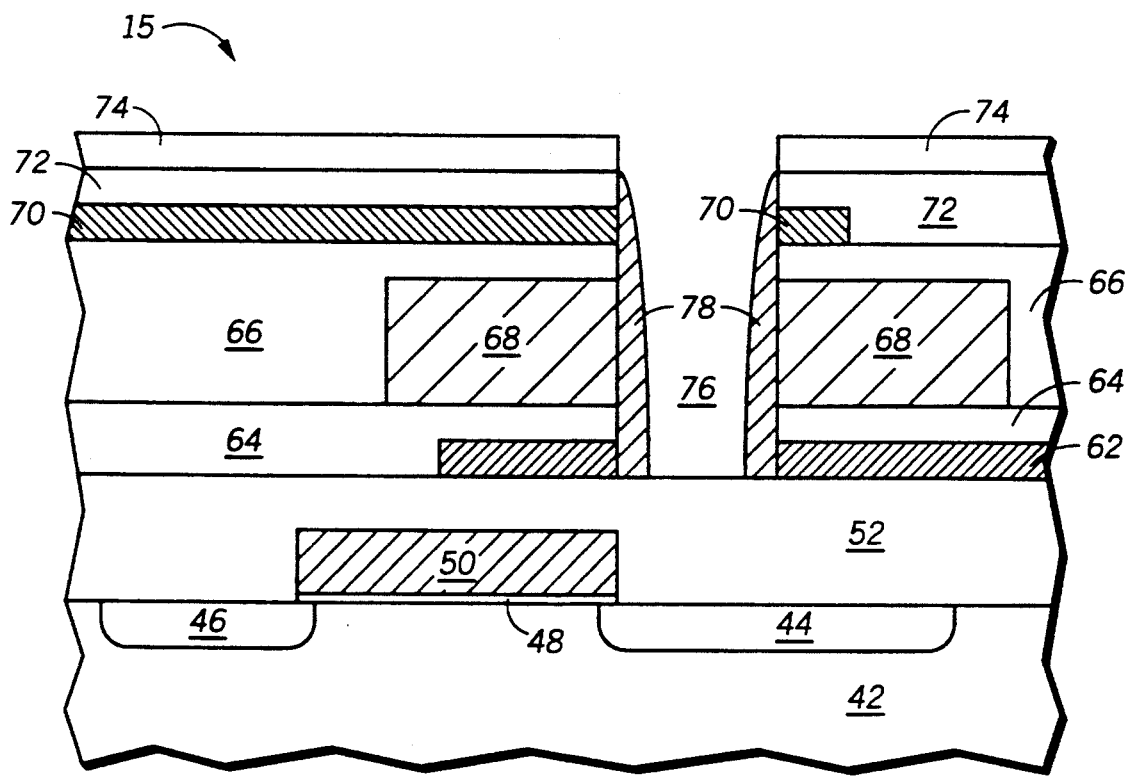

In FIG. 10, a conductive sidewall spacer 78, which is preferably a polysilicon spacer, is used to electrically connect conductive layer 62 to conductive layer 70. Collectively, conductive layers 62 and 70 and spacer 78 function as the conductor 40 of FIG. 1.

Figure 11:
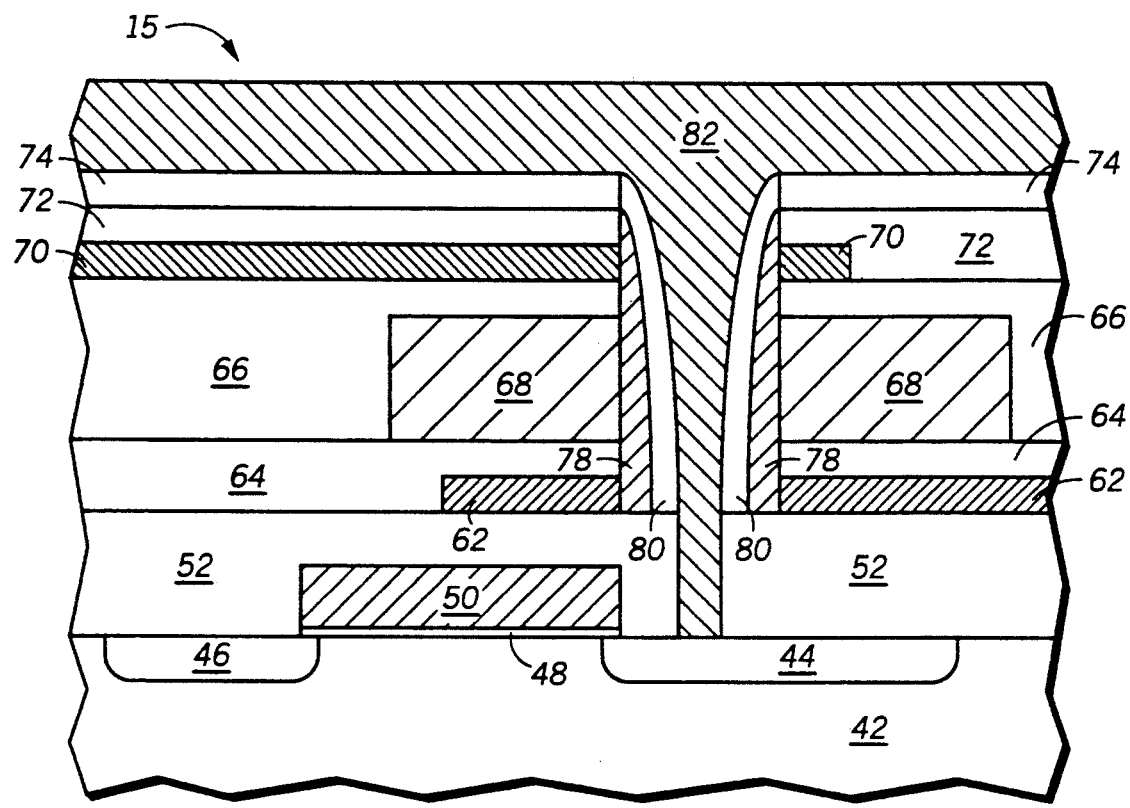

In FIG. 11, a dielectric spacer 80, which is preferably silicon nitride, is used to electrically insulate and isolate sidewall spacer 78. A conductive layer 82, which is preferably metal or polysilicon, is used to contact to the electrode 44 and is analogous to bit line conductor 32 of FIG. 1.

Figure 12:
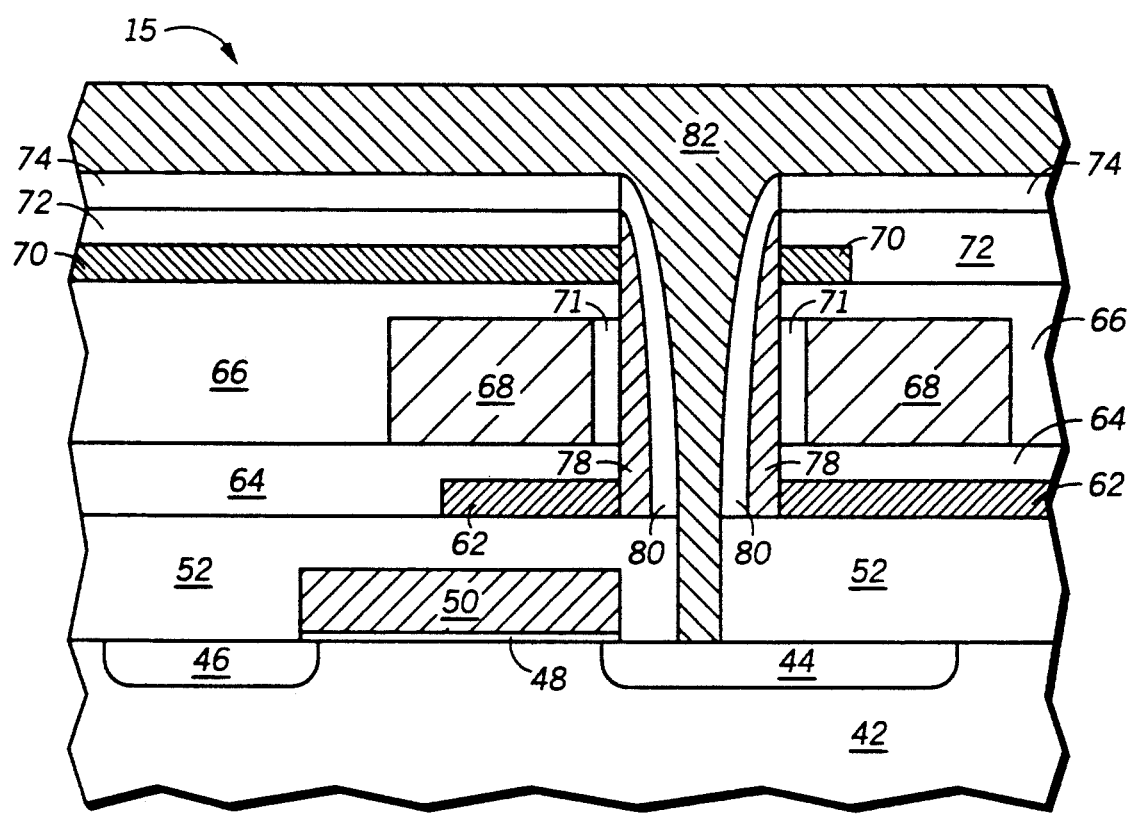
FIG. 12 illustrates, in cross-sectional form, a magnetic memory device having a ferromagnetic core with a dielectric sidewall in accordance with the present invention.

In FIG. 12, known isotropic etch techniques, known RIE etching, and/or known spacer technology can be used to form a sidewall dielectric region 71 during formation of contact hole 76 in FIG. 9. Dielectric region 71 is used to isolate the ferromagnetic region 68 from the conductive spacer 78. Dielectric region 71 is optional and is not needed in order for the device 15 to operate properly.

Figure 13:
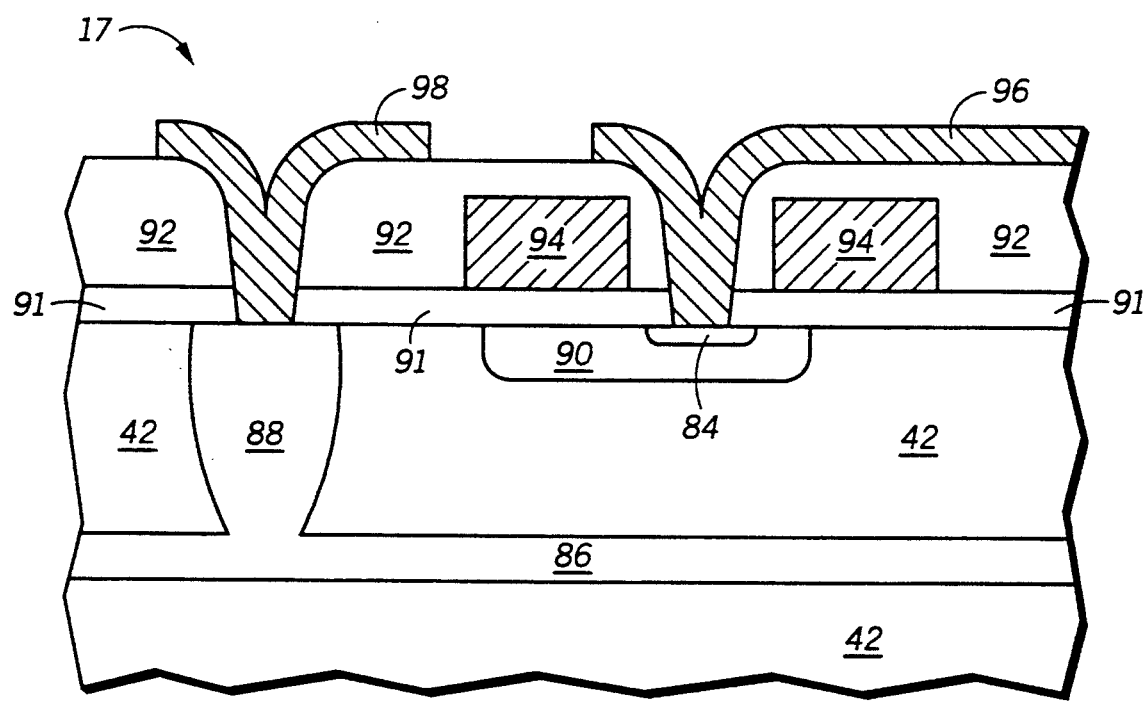
FIG. 13 illustrates, in cross-sectional form, another magnetic memory device in accordance with the present invention and having a bipolar transistor.

FIG. 13 illustrates a ferromagnetic storage device 17 that uses a bipolar transistor instead of the MOSFETs of FIGS. 1-12. Due to the fact that the process flow is similar to the processes already discussed, the process for making storage device 17 is not discussed in detail. Elements in FIG. 13 that are analogous to elements in FIGS. 2-12 are identically labeled. A substrate 42 is provided. A collector is formed via doped regions 86 and 88. A base is formed via a doped region 90. Doped region 90 is connected to a conductor (not illustrated) that is analogous to the word line conductor 34 of FIG. 1. A doped region 84 forms an emitter for the bipolar transistor. The bipolar transistor is analogous to the transistor 22 of FIG. 1. It should be noted that all the transistors that are used to form memory cells in circuit 10 will have collectors which carry a power supply voltage. Therefore the connection illustrated by doped region 88 is not required for every memory cell. The doped region 86 may function as a collector for a plurality of ferromagnetic memory cells and have only one connection region via doped region 88.

A ferromagnetic region 94 is formed. Region 94 is analogous to the core 12 of FIG. 1. Dielectric layers 91 and 92 are formed to isolate the ferromagnetic region 94 from other materials in device 17. A conductive layer 96 is formed to contact to the emitter doped region 84 and functions as the conductors 32 and 40 of FIG. 1. A conductive layer 98 connects the collector to a supply voltage. Conductive layer 98 is analogous to power supply conductor 28 of FIG. 1. It should be apparent from FIG. 13 that all the devices 11, 13, and 15 presented herein may be formed with bipolar transistors instead of MOSFETs.

In summary, presented herein is a ferromagnetic memory circuit and an associated ferromagnetic memory device and process. The circuit and device taught herein provides a static nonvolatile memory cell that is electrically programmable. Therefore, the inventive device presented herein functions in a manner similar to EEPROMs. The device presented herein, while storing data like an EEPROM, is capable of a surface area that is on the order of that achieved by a DRAM. DRAMs are the most dense memory circuit that are commercially available in an integrated circuit. Magnetic memory will be more reliable and robust than typical nonvolatile memories such as EEPROMs and EPROMs. Magnetic memories are more resistant than other memory cells to radiation and other phenomena such as soft error faults. In some cases, magnetic memory cells may be virtually impervious to radiation-related errors. In addition, a magnetic memory, as taught herein, may operate as a SRAM memory. The inventive device taught herein is simpler to manufacture and has less substrate surface area than most conventional SRAM cells. Refresh cycles, such as the refresh cycles used in DRAMs, are not necessary for magnetic memory. In addition, most magnetic memory circuits are not formed on an integrated circuit, and therefore magnetic memory is difficult to integrate into computer systems and other applications. The ability to integrate the inventive semiconductor-based ferromagnetic memory taught herein side-by-side with other small integrated circuits increases the usefulness of magnetic memory in several system applications.

While the present invention has been illustrated and described with reference to specific embodiments, further modifications and improvements will occur to those skilled in the art. For example, many ferromagnetic materials can be used to form the ferromagnetic regions or cores described herein. The ferromagnetic material only has to have the properties of being able to adhere to a semiconductor surface in some manner and being able to be selectively etched in some manner. Spacers can be used in many points in the process flow to isolate ferromagnetic material from conductive materials such as polysilicon. Bipolar, MOSFET, thin film transistors (TFTs), silicon on insulator (SOI) transistors and other transistors can be used in the memory cells described herein. The shape of the ferromagnetic material is preferably cylindrical but may be any geometry such as a rectangle, triangle, oval, square, circle, and other geometries. In some cases, the ferromagnetic material may not need to be etched into individual cores. A sheet of ferromagnetic material can be deposited to cover an entire integrated circuit. A plurality of holes can be formed in the ferromagnetic material at different locations over the integrated circuit to form localized memory cells from one sheet of ferromagnetic material. It is to be understood, therefore, that this invention is not limited to the particular forms illustrated and that it is intended in the appended claims to cover all modifications that do not depart from the spirit and scope of this invention.

I claim:

1. A ferromagnetic memory circuit comprising:
a transistor having a first current electrode, a second current electrode for receiving a power supply voltage, and a control electrode;
a ferromagnetic core positioned in close proximity to the transistor wherein the ferromagnetic core and the transistor are formed overlying a same substrate material;
a power supply line conductor coupled to the second current electrode of the transistor;
a bit line conductor passing through the ferromagnetic core and being coupled to the first current electrode of said transistor; and
a word line conductor coupled to the control electrode of the transistor.

2. The circuit of claim 1 further comprising:
a sense line conductor formed through the ferromagnetic core and isolated from the bit line.

3. The circuit of claim 1 wherein the transistor is a bipolar transistor and the first current electrode is an emitter, the second current electrode is a collector, and the control electrode is a base.

4. The circuit of claim 1 wherein the transistor is a field effect transistor wherein the first current electrode and the second current electrode are respectively either a source and a drain or a drain and a source, and the control electrode is a gate.

5. A ferromagnetic memory cell comprising:
a substrate having a surface;
a transistor having a first current electrode formed within the substrate and exposed at the surface of the substrate, a second current electrode formed within the substrate and exposed at the surface of the substrate, and a control electrode which lies substantially between the first current electrode and the second current electrode and controls current flow between the first current electrode and the second current electrode;
a ferromagnetic region overlying the substrate and positioned in close proximity to the transistor;
an opening formed in the ferromagnetic region; and
a first conductive region formed within the opening in the ferromagnetic region, the first conductive region being electrically coupled to the first current electrode.

6. The memory cell of claim 5 wherein the transistor is a bipolar transistor and the first current electrode is an emitter, the second current electrode is a collector, and the control electrode is a base.

7. The memory cell of claim 5 wherein the transistor is a field effect transistor wherein the first current electrode and the second current electrode are respectively either a source and a drain or a drain and a source, and the control electrode is a gate.

8. The memory cell of claim 5 wherein the first conductive region is formed as a bit line conductor and is used for erasing and programming the ferromagnetic region, and the first conductive region has a periphery.

9. The memory cell of claim 8 further comprising:
a second conductive region formed laterally adjacent and around the periphery of the first conductive region, the second conductive region being adjacent the opening in the ferromagnetic region and functioning as a sense line for externally providing a logic value stored by the ferromagnetic region.

10. The memory cell of claim 9 wherein the second conductive region is formed as a sidewall spacer.

11. The memory cell of claim 9 wherein the second conductive region further comprises:
a sidewall dielectric region which is formed laterally adjacent the ferromagnetic region and isolates the second conductive region from the ferromagnetic region.

12. An integrated circuit having a plurality of memory cells, each memory cell within the plurality of memory cells comprising:
a substrate portion;
a transistor having an electrode overlying the substrate portion;
a conductive element connected to the electrode, the conductive element overlying the substrate portion; and
a ferromagnetic core coupled to the conductive element wherein the magnetic energy in the ferromagnetic core is changed by current through the ferromagnetic core, the ferromagnetic core overlying the substrate portion.

13. The integrated circuit of claim 12 wherein the transistor is a metal oxide semiconductor (MOS) transistor.

14. A memory cell comprising:
a transistor having an electrode;
a dielectric layer overlying the transistor and having an opening which exposes the electrode;
a conductive element connected to the electrode; and
a ferromagnetic core formed in close proximity to the conductive element so that the ferromagnetic core is electrically coupled to the conductive element wherein the magnetic energy in the ferromagnetic core is selectively changed by a current flowing through the conductive element, the ferromagnetic core overlying the dielectric layer.

15. The memory cell of claim 14 wherein the transistor is a metal oxide semiconductor (MOS) transistor.

16. An integrated circuit memory cell comprising:
a semiconductor substrate;
a transistor device formed within the semiconductor substrate;
a dielectric layer overlying the transistor device;
an annular ferromagnetic core overlying the dielectric layer and being coupled to the transistor device.

17. The integrated circuit memory cell of claim 16 further comprising:
a conductor connected to the transistor device and positioned in close proximity to the annular ferromagnetic core, current through the conductor affecting magnetic energy stored in the annular ferromagnetic core.

18. The integrated circuit memory cell of claim 16 wherein the annular ferromagnetic core contains a value selected from a group consisting of: a logic high value and a logic low value.

19. A ferromagnetic memory circuit comprising:
a power supply conductor;
a transistor having a first current electrode, a second current electrode for receiving a power supply voltage from the power supply conductor, and a control electrode;
a ferromagnetic core formed directly overlying a portion of the transistor and being encapsulated in a dielectric layer; and
a conductor passing adjacent to the ferromagnetic core and being coupled to the first current electrode of said transistor, the conductor selectively affecting a magnetic field within the ferromagnetic core.

20. A ferromagnetic memory cell comprising:
a transistor having a first current electrode, a second current electrode, and a control electrode which lies substantially between the first current electrode and the second current electrode and controls current flow between the first current electrode and the second current electrode;
a ferromagnetic region positioned adjacent the transistor and being at least partially surrounded by a dielectric layer; and
a first conductive region formed adjacent the ferromagnetic region, the first conductive region being electrically coupled to the first current electrode.

21. An integrated circuit wherein the integrated circuit has a plurality of magnetic memory devices formed on a substrate, one magnetic memory device comprising:
only one single transistor;
a ferromagnetic core in close proximity to the only one single transistor;
a conductor coupled to the transistor and being positioned close enough to the ferromagnetic core to allow the ferromagnetic core to store a logic value selected from a group consisting of: a logic one and a logic zero, in response to a current flow through the conductor.

22. A semiconductor magnetic memory device comprising:
a substrate;
a transistor formed from the substrate and having a first current electrode overlying the substrate, a second current electrode overlying the substrate and being separated from the first current electrode by a channel region, and a gate electrode which overlies the channel region;
a first dielectric layer formed overlying the transistor;
a ferromagnetic region formed overlying the first dielectric layer, the ferromagnetic region having a sidewall;
a second dielectric layer formed overlying the ferromagnetic region; and
a first conductive region formed adjacent the sidewall of the ferromagnetic region.

23. The semiconductor magnetic memory device of claim 22 wherein a dielectric sidewall spacer is formed laterally adjacent the sidewall of the ferromagnetic region.

24. The semiconductor magnetic memory device of claim 22 wherein a second conductive region is formed adjacent the first conductive region.

* * * * *